United States Patent [19]

Sokoloff

[11] Patent Number: 4,513,265
[45] Date of Patent: Apr. 23, 1985

[54] 3-PHASE SWITCHED CAPACITOR CIRCUIT HAVING AN INDUCTIVE CHARACTERISTIC

[75] Inventor: Boris Sokoloff, Grenoble, France

[73] Assignee: Societe Pour L'Etude Et La Fabrication De Circuits Integres Speciaux - E.F.C.I.S., Grenoble, France

[21] Appl. No.: 422,390

[22] Filed: Sep. 24, 1982

[30] Foreign Application Priority Data

Oct. 2, 1981 [FR] France .................. 81 18636

[51] Int. Cl.³ ............................................. H03H 11/48
[52] U.S. Cl. ...................................... 333/214; 333/173
[58] Field of Search ............... 333/214, 213, 173, 215; 330/107, 51

[56] References Cited

U.S. PATENT DOCUMENTS 4,354,169  10/1982  Nossek ..................... 333/214 X
4,364,116  12/1982  Nossek ..................... 333/214 X Primary Examiner—Eugene R. LaRoche
Assistant Examiner—Benny Lee
Attorney, Agent, or Firm—Roland Plottel

[57] ABSTRACT

A circuit having an inductive characteristic for the realization of filters in integrated circuits is constructed solely from switched capacitors and an operational amplifier. The circuit is provided between a first and a second terminal with a first capacitor in series with at least one switch. The switch is capable either of connecting the first capacitor between said two terminals or of isolating said capacitor from the first terminal. The circuit further comprises an operational amplifier having a feedback path between its output and its input via a second capacitor, and additional switches for transferring charges from the input of the circuit to the first capacitor and then from the first capacitor to the second capacitor, then again from the second capacitor to the first capacitor. Under these conditions, the circuit exhibits the characteristics of an inductance.

3 Claims, 7 Drawing Figures

3-PHASE SWITCHED CAPACITOR CIRCUIT HAVING AN INDUCTIVE CHARACTERISTIC

BACKGROUND OF THE INVENTION

1. Field of the Invention

This invention relates to integrated circuits and more particularly to the field of electric filters.

2. Description of the Prior Art

It has been known for a long time that certain transfer functions of filters can be performed by using passive circuits in a ladder network consisting only of inductances and capacitances. This type of circuit makes it possible to obtain very narrow passbands with a very high rejection outside the passband and relative insensitivity to variations in values of inductances and capacitances.

Unfortunately, inductors cannot be realized in accordance with integrated-circuit fabrication techniques, especially if they are intended to have high values.

Since limited space requirements essentially call for the use of fully integrated filters on very small semiconductor surfaces, filter networks requiring inductances are usually avoided in favor of purely active filters. The major drawback of such filters lies in the fact that they entail the need for a large number of operational amplifiers, namely at least n amplifiers in respect of one n-order filter. These filters are often switched-capacitor filters or in other words filters in which all the resistors have been replaced by high-frequency switched capacitors as explained in two articles published in the IEEE Journal of Solid State Circuits, volume SC-12, No 6, December 1977, pages 592 to 607 (Caves et alia, Hosticka et alia).

SUMMARY OF THE INVENTION

According to this invention, a fully integrable circuit element in which the inductance characteristic can have a very high value (several henrys) is constructed in a very simple manner. This element can be associated with other circuit elements in order to realize filters which are constructed on the basis of passive inductance-capacitance ladder filter diagrams.

The circuit according to the present invention is of extremely simple design and this is one of its main advantages since it comprises only one operational amplifier, a few switches together with a circuit for the cyclic control of these switches, and two capacitors (having a very low value of capacitance). The entire circuit can be integrated, preferably in accordance with an MOS (metal-oxide-semiconductor) technology. Operational amplifiers constructed in accordance with this technology have already existed for a long time. The switches can each be formed by an MOS transistor, and the capacitors (on the order of a few tens or hundreds of picofarads) can be fabricated by using as a dielectric between two conductive layers the thin oxide that serves to form the MOS transistors.

The circuit according to the invention comprises between a first and a second terminal which simulate the terminals of an inductance, a first capacitor in series with at least one switch which is capable either of connecting the first capacitor to the first terminal or of isolating said capacitor from said first terminal. The circuit further comprises an operational amplifier having a feedback connection via a second capacitor between its output and its input, and additional switches adapted to connect the first capacitor to different points of the circuit. The different switches are controlled by a switching control logic circuit for successively establishing a number of connections in a periodic cycle at a distinctly higher frequency than that of the signals to be applied between the terminals of the circuit which simulates the inductance. The connections thus made in succession are as follows:

(a) the first capacitor is connected between the first terminal and the second terminal of the circuit, the output of the operational amplifier being connected only to the second capacitor;

(b) the first capacitor is connected between the input of the operational amplifier and a ground terminal of the circuit (which defines a reference potential for the operational amplifier);

(c) the first capacitor is connected between the output of the operational amplifier and the ground terminal;

(d) the first capacitor is again connected between the first and the second terminal.

The second terminal of the circuit can coincide with a ground terminal if, for example, the inductance is mounted between a signal terminal and ground.

If the inductance is inserted in series in a circuit, provisions must be made for two specific switches for connecting the first capacitor either to ground (steps b, c) or to the second terminal of the circuit (steps a, d).

It will be seen in the detailed description of the invention that the value of the inductance is equal to $C_1/C_0^2 f^2$ if $C_0$ and $C_1$ are the values of the first and second capacitors and f is the frequency of the repetitive cycle of operation of the switches.

Since the inductance is in principle employed in conjunction with a capacitor for realizing rejector circuits having a resonance frequency which depends on the product of the inductance times the capacitance, it is apparent that this frequency will essentially be a function of a ratio of capacitances. Now in MOS technology, it is in fact known to produce very accurate ratios of capacitances even if it is not known to determine absolute values of precise capacitances. Furthermore, the switching frequency f may also be very well known, with the result that LC filters realized with this simulated inductance will have resonance frequencies which can be very precisely defined.

Among the advantages of this simulated inductance which are worthy of mention is the fact that it permits the realization of an n-order filter comprising practically one-half the number of operational amplifiers compared with an active filter of the same order. In addition, it is not at all necessary to use high-performance amplifiers. In particular, an amplifier having a low gain will be the equivalent of an inductance having a finite overvoltage coefficient and is wholly suitable for use in a passive ladder filter. Finally, the circuit element according to the invention is of appreciably simpler design (a smaller number of capacitors and switches) than circuits which have been devised up to the present time in attempts to realize simulated inductances (article by Nossek and Temes in IEEE Transactions on Circuits and Systems, vol. CAS-27 No 6, June 1980). In particular, the circuit according to the present invention requires only three clock phases for each cycle.

DESCRIPTION OF THE DRAWINGS

Other features of the invention will be more apparent upon consideration of the following description and accompanying drawings, wherein.

DESCRIPTION OF THE PREFERRED EMBODIMENTS

Figure 1:
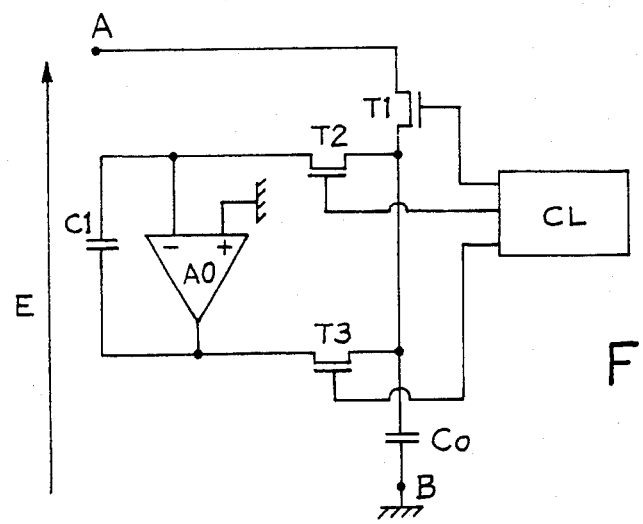
FIG. 1 is a diagram of the circuit according to the invention and equivalent to an inductance which can be placed between a signal terminal and a ground terminal.

The circuit of the invention as illustrated in FIG. 1 has two terminals A and B, the terminal B being connected in this case to ground in order to realize a circuit which simulates an inductance connected between a signal terminal (terminal A) and ground.

The circuit comprises a first capacitor Co in series with a switch constituted in this instance by an insulated-gate transistor T1 (MOS field-effect transistor), this series assembly being connected between the terminals A and B.

A second switch, also constituted and represented by an MOS transistor T2, is connected between the common node of capacitor Co and of transistor T1 and the reversing input of an operational amplifier AO (the non-reversing input of which is connected to ground).

A third switch, constituted and represented by an MOS transistor T3, is connected between the output of the operational amplifier and the common node of the first capacitor Co and transistors T1 and T2.

A second capacitor C1 is connected between the output and the reversing input of the operational amplifier AO in order to serve as capacitive feedback for said amplifier.

Finally, a switching control logic circuit CL controls the gates of the three transistors for turning them on or off in a periodic cycle at a switching frequency f which is distinctly higher than the probable frequencies of the signals applied to the terminal A.

The control cycle is such that the transistors are switched into conduction during separate and distinct time intervals. In other words, only one transistor at a time is in the conducting state during each phase of the cycle.

The conduction times of each transistor therefore correspond to a fraction of the period of the switching cycle.

Figure 2A:
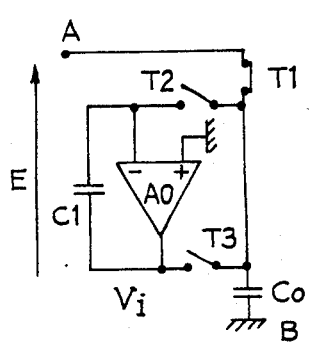
FIGS. 2a, 2b and 2c represent the three phases of the switch-closing cycle at each period of the switching control circuit.
Figure 2B:
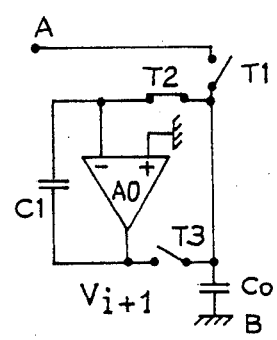
Figure 2C:
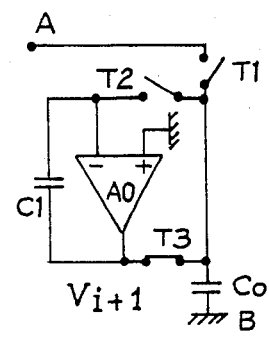

This cycle is shown in detail in FIGS. 2a, 2b and 2c which represent respectively the first, the second and the third phase of the switching cycle at the frequency f.

In order to explain this operation and to show by means of a simple calculation how and in what respect the circuit behaves as an inductance placed between the terminals A and B, it will be postulated:

that a voltage E is applied between the terminals A and B, said voltage being supplied by a voltage source having practically zero impedance;

that the output voltage of the amplifier AO at the end of an $i^{th}$ switching cycle is $V_i$, and that the terminal voltage of the capacitor Co at the end of the cycle i is also $V_i$; as will become apparent hereinafter, the point just mentioned results from the fact that the last stage of a cycle actually consists in charging the capacitor Co to the value of voltage which is present at the output of the operational amplifier.

The first phase of the following cycle, or in other words the cycle i+1, consists in turning-on the transistor T1 (the other transistors being in the non-conducting state). The capacitor Co then charges to the voltage E; this charge takes place very rapidly by reason of the low value of capacitance and is completed before the transistor turns off. For example, if the capacitor has a capacitance of the order of 100 picofarads in series with impedances of 1000 ohms produced by the source, by switches and the like, provision must clearly be made for a closing period of a fraction of microsecond, which gives an idea of the maximum order of magnitude of the frequency f of the switching cycle.

The charge received by the capacitor Co is equal to Co $(E-V_i)$ since it rises from a voltage $V_i$ to a voltage E. Since this will be the only charge which flows into the signal terminal A during the cycle i+1 by reason of the fact that the switch T1 will subsequently be open throughout the entire duration of the cycle, it can be stated that a mean current Co $(E-V_i)/T$ will have flowed during the period T of this cycle (T=1/f).

During this initial phase, the output voltage $V_i$ of the amplifier AO has not varied since it is assumed to be an ideal operational amplifier having an infinite input impedance and high gain, and the feedback capacitor C1 charged to the voltage $V_i$ has not been able to discharge.

During the second phase (shown in FIG. 2b), after transistor T1 has turned-off, transistor T2 is turned-on. This has the effect of abruptly applying the charge CoE of the first capacitor to the input of the operational amplifier. Feedback from this amplifier via the capacitor C1 results in transfer of the entire charge from capacitor Co into capacitor C1 in order to restore to zero the voltage between the reversing and non-reversing inputs of the amplifier. This transfer takes place with a negative sign. In other words, if the voltage E is positive with respect to ground, the voltage $V_i$ at the terminals of the capacitor will be reduced.

The charge of the capacitor C1 was initially $C1V_i$ and therefore becomes $C1V_i - CoE$. Since the voltage at the reversing input of the amplifier is restored to zero (potential of the non-reversing input), it is the output voltage of the amplifier which varies and becomes $V_{i+1}$ such that:

$$C1V_{i+1} = C1V_i - CoE$$

where $$V_{i+1} = V_i - E(Co/C1).$$

The third phase (FIG. 2c) then consists in applying this new voltage to the capacitor Co. To this end, the switch constituted by transistor T2 is opened and the switch constituted by transistor T3 is closed The capacitor Co is thus connected between the output (at $V_{i+1}$) of the amplifier and ground. It will be noted that the capacitor Co is charged to $V_{i+1}$ without causing the capacitor C1 to discharge (and therefore without modifying the output voltage $V_{i+1}$) since the capacitor C1 is in series with the input impedance (assumed to be infinite) of the amplifier AO.

At the end of the cycle $i+1$ and therefore at the beginning of the cycle $i+2$, a new initial situation has arisen in which the capacitor Co is no longer charged to the voltage $V_i$ but to the voltage $V_{i+1} = V_i - ECo/C1$. This means that, when the switch T1 is again closed in order to charge the capacitor Co to the voltage E (assuming that it has not departed from this value between two consecutive periods of the switching cycle), the charge which will flow into the signal terminal will be Co $(E-V_{i+1})$, that is, Co $(E-V_i) + ECo^2/C1$.

Similarly, at the end of the cycle $i+2$, the charge will be Co $(E-V_{i+2})$, that is, Co $(E-V_i) + ECo^2/C1$, and so on: at each period, the charge transferred increases by $ECo^2/C1$; the mean current which is equal to this charge divided by the period T therefore increases by a constant $ECo^2/C1T$ at each period.

This regular stair-step progression, which is comparable with a linear current rise if consideration is given to a frequency which is distinctly lower than the switching frequency, corresponds exactly to the operation of an inductance. In other words, the current variation per unit of time dI/dt is proportional to the voltage applied to the inductance: $E = LdI/dt$.

In this case, dI during a period T is equal to $ECo^2/C1T$, whence $dI/T = ECo^2/C1\ T^2$.

This accordingly represents an equivalent inductance having the value $L = C1T^2/Co^2$ or $L = C1/Co^2\ f^2$.

A simple order of magnitude explains the advantage of this circuit: if $f = 10^5$ hertz, $C1 = Co = 100$ picofarads ($10^{-10}$ farads), then $L = 1$ henry. This value can be increased by reducing the values of capacitances but this produces a corresponding increase in sensitivity to stray capacitances of the same order of magnitude. Alternatively, said value can be increased by reducing the switching frequency but a limitation is imposed in that case by the frequency of the signals which can be applied to the signal terminal A.

Figure 3:
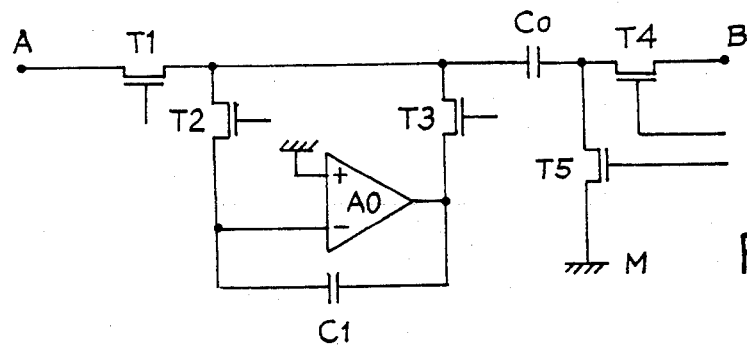
FIG. 3 shows an alternative form of construction for an inductance to be placed in series in a circuit.

FIG. 3 shows an alternative circuit arrangement which is intended to replace an inductance in series between two points, neither of which constitutes a ground of the circuit or a fixed voltage reference point.

There is therefore shown separately a ground terminal M (to which the non-reversing input of the operational amplifier A0 is again connected), and a terminal B which constitutes (in the same manner as terminal A) a terminal of the equivalent inductance which it is sought to realize.

The circuit of FIG. 3 is the same as the circuit of FIG. 2 except for the connection between the first capacitor Co and the terminal B: this connection was direct in FIG. 2. In FIG. 3, said connection is established from said capacitor via a fourth switch (transistor T4) to the terminal B and via a fifth switch (transistor T5) to ground. The transistors T4 and T5 are controlled in the same manner as transistors T1, T2 and T3 by the logic circuit CL (not shown in FIG. 3).

The operation differs from that of FIG. 2 in that the initial phase additionally consists in turning-off transistor T5 and in turning-on transistor T4 whilst the second and the third phase consist in turning-on transistor T5 and turning-off transistor T4 after transistor T1 has been turned-off. The phases of turn-on of transistors T4 and T5 are separate and distinct so as to ensure that there is no danger of connection of terminal B to ground. Similarly, the phases of turn-on of transistors T1 and T5 are separate as is the case with those of transistors T1, T2, those of transistors T1, T3 and those of transistors T2, T3.

Figure 4:
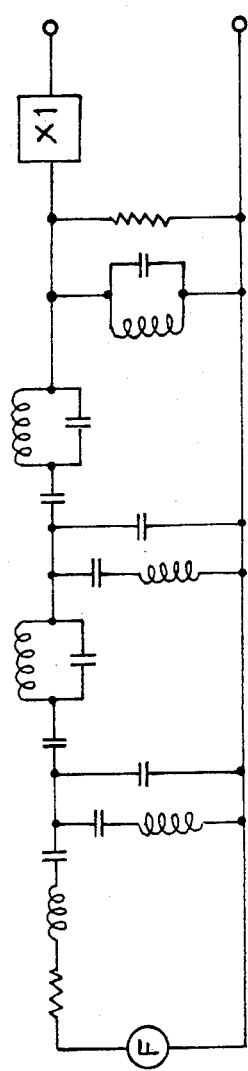
FIG. 4 shows a conventional ladder filter.
Figure 5:
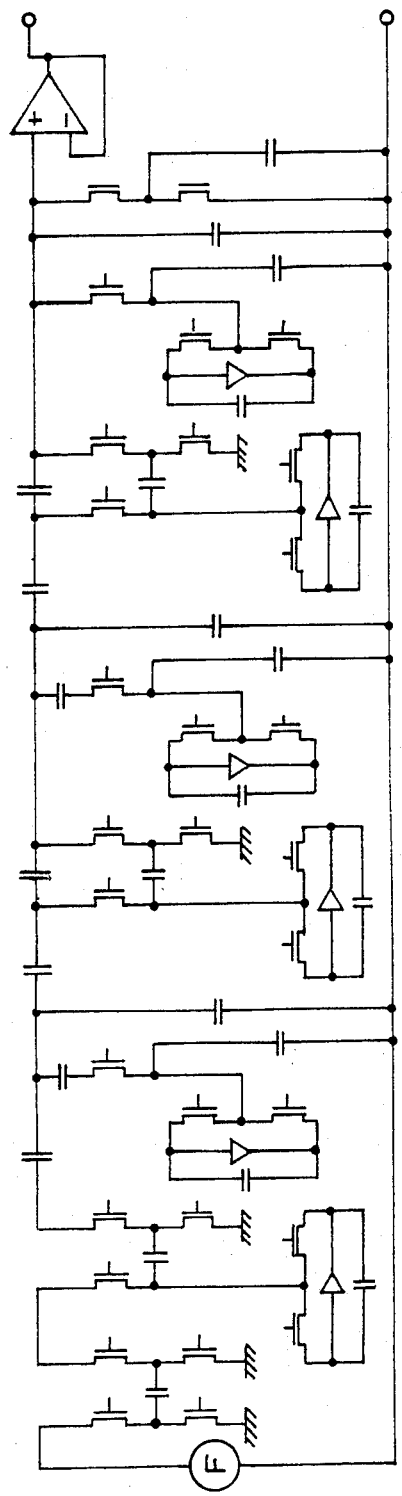
FIG. 5 shows the same filter but transposed in accordance with the invention.

FIG. 4 shows by way of example a conventional passive filter of the twelfth order (bandpass filter) which makes use of a ladder network of inductances and capacitors and FIG. 5 shows a filter which is the transposition of this latter as contemplated by the invention, in which the resistors have been replaced by switched capacitors and in which the inductances have been replaced by circuits in accordance with FIG. 1 or FIG. 3. As can be observed, the operational amplifiers of this twelfth-order filter are only six in number (in addition to the impedance-matching device at the output). The logic circuit CL which serves to control switching of the different switches is not shown in FIG. 5.

What is claimed is:

1. A circuit having an inductance characteristic, comprising a first terminal; a second terminal; an operational amplifier, having an input and an output; a first capacitor; a second capacitor; a first switch; a second switch; and a third switch; said switches being controlled by a switching control logic circuit according to a periodic cycle of not more than three non overlapping phases; said first, second and third switches being respectively closed during a first, second and third phase; said first switch being connected on one side to said first terminal, and on the other side being connected only to three components namely to a first side of said first capacitor and to one side second and third switches; said second switch being connected on the other side to said inut of operational amplifier; said third switch being connected on the other side to said output of said operational amplifier; said second capacitor being connected on one side to said input and on the other side only to said output and to the other side of said third switch; said first capacitor having a second side connected to said second terminal during said first phase and to ground during second and third phases.

2. A circuit according to claim 1 wherein said second terminal is directly connected to ground.

3. A circuit according to claim 1 wherein the second side of said first-capacitor is connected, through a fourth switch cloes during said first-phase, to said second terminal, and is also connected, through a first switch closed during said second and third phases, to ground.

* * * * *